United States Patent
Yang et al.

(10) Patent No.: US 12,322,728 B2
(45) Date of Patent: Jun. 3, 2025

(54) METHOD OF MANUFACTURING DIE STACK STRUCTURE

(71) Applicant: Taiwan Semiconductor Manufacturing Company, Ltd., Hsinchu (TW)

(72) Inventors: Ching-Jung Yang, Taoyuan (TW); Hsien-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 229 days.

(21) Appl. No.: 17/669,383

(22) Filed: Feb. 11, 2022

(65) Prior Publication Data

US 2022/0165711 A1 May 26, 2022

Related U.S. Application Data

(62) Division of application No. 15/939,310, filed on Mar. 29, 2018, now Pat. No. 11,251,157.
(Continued)

(51) Int. Cl.
*H01L 21/8234* (2006.01)
*H01L 21/66* (2006.01)
(Continued)

(52) U.S. Cl.
CPC .......... *H01L 25/0657* (2013.01); *H01L 22/32* (2013.01); *H01L 23/3135* (2013.01);
(Continued)

(58) Field of Classification Search
CPC ................ H01L 25/0657; H01L 25/50; H01L 2224/08145; H01L 24/08; H01L 24/27; H01L 24/83; H01L 2224/0392; H01L 22/32; H01L 24/32; H01L 23/528; H01L 2224/002373; H01L 2224/03616; H01L 2224/05557; H01L 2224/273;
(Continued)

(56) References Cited

U.S. PATENT DOCUMENTS 8,993,380 B2  3/2015  Hou et al.
9,281,254 B2  3/2016  Yu et al.
(Continued)

OTHER PUBLICATIONS

"Office Action of U.S. Continuation Application, U.S. Appl. No. 18/733,880", issued on Mar. 27, 2025, p. 1-p. 15.

*Primary Examiner* — David Chen
(74) *Attorney, Agent, or Firm* — JCIPRNET (57) ABSTRACT

A method of manufacturing a die stack structure includes the following steps. A first bonding structure is formed over a front side of a first die. The method of forming the first bonding structure includes the following steps. A first bonding dielectric material is formed on a first test pad of the first die. A first blocking layer is formed over the first bonding dielectric material. A second bonding dielectric material and a first dummy metal layer are formed over the first blocking layer. The first dummy metal layer and the first test pad are electrically isolated from each other by the first blocking layer. Thereafter, a second bonding structure is formed over a front side of a second die. The first die and the second die are bonded through the first bonding structure and the second bonding structure.

20 Claims, 9 Drawing Sheets

Related U.S. Application Data (60) Provisional application No. 62/580,422, filed on Nov. 1, 2017.

(51) Int. Cl.

| | | |
|---|---|---|
| *H01L 23/00* | (2006.01) | |
| *H01L 23/31* | (2006.01) | |
| *H01L 23/48* | (2006.01) | |
| *H01L 23/538* | (2006.01) | |
| *H01L 25/00* | (2006.01) | |
| *H01L 25/065* | (2023.01) | |
| *H01L 27/088* | (2006.01) | |
| *H01L 29/423* | (2006.01) | |
| *H01L 29/66* | (2006.01) | |
| *H01L 29/78* | (2006.01) | |
| *H01L 23/522* | (2006.01) | |
| *H01L 23/528* | (2006.01) | |

(52) U.S. Cl.
CPC ........ *H01L 23/481* (2013.01); *H01L 23/5384* (2013.01); *H01L 23/5389* (2013.01); *H01L 24/08* (2013.01); *H01L 24/27* (2013.01); *H01L 24/32* (2013.01); *H01L 24/83* (2013.01); *H01L 25/50* (2013.01); *H01L 23/3128* (2013.01); *H01L 23/5226* (2013.01); *H01L 23/528* (2013.01); *H01L 23/5386* (2013.01); *H01L 24/03* (2013.01); *H01L 2224/02373* (2013.01); *H01L 2224/03616* (2013.01); *H01L 2224/05557* (2013.01); *H01L 2224/0557* (2013.01); *H01L 2224/0812* (2013.01); *H01L 2224/18* (2013.01); *H01L 2224/273* (2013.01); *H01L 2224/27614* (2013.01); *H01L 2224/27616* (2013.01); *H01L 2224/29016* (2013.01); *H01L 2224/29187* (2013.01); *H01L 2224/32145* (2013.01); *H01L 2224/73204* (2013.01); *H01L 2224/73267* (2013.01); *H01L 2224/80895* (2013.01); *H01L 2224/80896* (2013.01); *H01L 2224/83895* (2013.01); *H01L 2224/83896* (2013.01); *H01L 2225/06541* (2013.01); *H01L 2225/06596* (2013.01); *H01L 2924/05042* (2013.01); *H01L 2924/05442* (2013.01); *H01L 2924/059* (2013.01); *H01L 2924/19011* (2013.01); *H01L 2924/19102* (2013.01)

(58) Field of Classification Search
CPC . H01L 2224/83896; H01L 2224/83895; H01L 2224/29187; H01L 2224/29016; H01L 2224/27614; H01L 2224/32145
USPC ........ 438/15, 59, 66, 107; 257/48, 432, 774, 257/E23.02, E23.179
See application file for complete search history.

(56) References Cited

U.S. PATENT DOCUMENTS

| | | |
|---|---|---|
| 9,299,649 B2 | 3/2016 | Chiu et al. |
| 9,330,946 B1 | 5/2016 | Farooq et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2013/0105663 A1* | 5/2013 | Endo ................. H01L 31/04 250/206 |
| 2013/0285056 A1* | 10/2013 | Pagani ............... H01L 22/14 228/119 |
| 2015/0014862 A1 | 1/2015 | Kwon et al. |
| 2015/0318267 A1* | 11/2015 | Yu ................. H01L 21/02271 257/774 |
| 2016/0013160 A1* | 1/2016 | Chun ................. H01L 25/50 257/751 |
| 2016/0225731 A1* | 8/2016 | Chandolu ............ H01L 25/50 |
| 2017/0033144 A1 | 2/2017 | Takahashi |
| 2017/0117253 A1* | 4/2017 | Yu ..................... H01L 24/25 |
| 2017/0278830 A1 | 9/2017 | Kim |
| 2018/0005940 A1* | 1/2018 | Chen ................ H01L 23/5226 |

\* cited by examiner

METHOD OF MANUFACTURING DIE STACK STRUCTURE

CROSS-REFERENCE TO RELATED APPLICATION

This is a divisional application of and claims the priority benefit of U.S. application Ser. No. 15/939,310, filed on Mar. 29, 2018, now allowed, which claims the priority benefit of U.S. provisional application Ser. No. 62/580,422, filed on Nov. 1, 2017. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are cross-sectional views of a method of forming a die stack structure in accordance with a first embodiment.

Figure 1A:
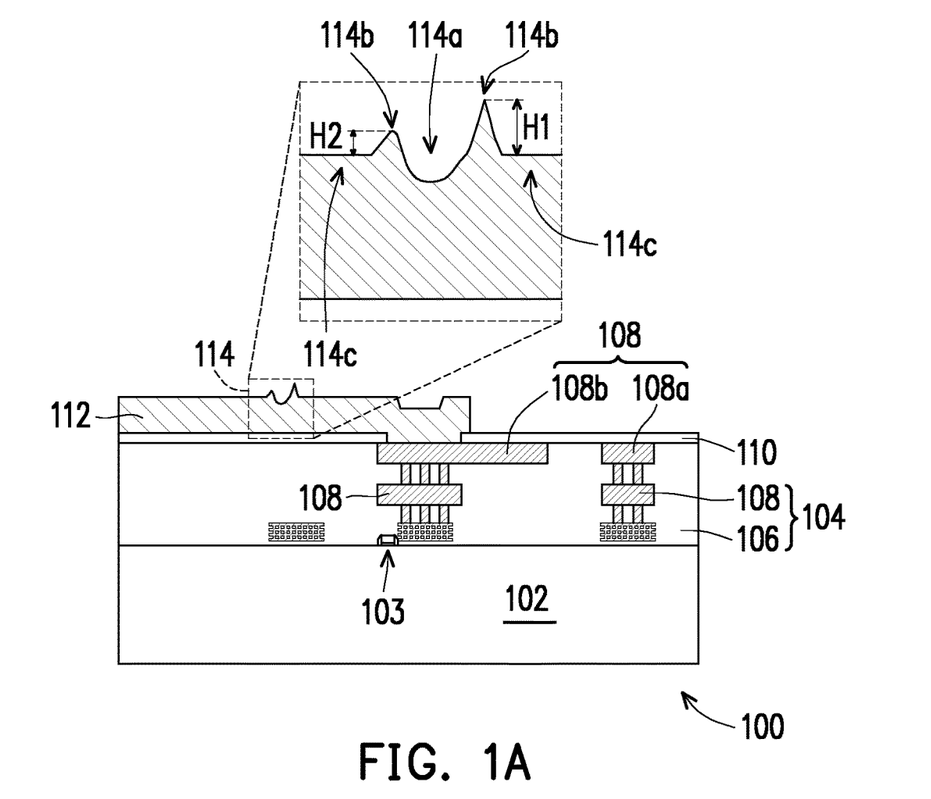
FIG. 1A to FIG. 1E are cross-sectional views of a method of forming a die stack structure in accordance with a first embodiment.

Referring to FIG. 1A, a first die 100 is provided. The first die 100 may be an application-specific integrated circuit (ASIC) chip, an analog chip, a sensor chip, a wireless and radio frequency chip, a voltage regulator chip or a memory chips, for example. The first die 100 includes a first semiconductor substrate 102, a first device region 103, a first interconnect structure 104, a first passivation layer 110, and a first test pad 112.

In some embodiments, the semiconductor substrate 102 may include silicon or other semiconductor materials. Alternatively, or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor.

In some embodiments, the first device region 103 is formed on the first semiconductor substrate 102 in a front-end-of-line (FEOL) process. The first device region 103 includes a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the first device region 103 includes a gate structure, source/drain regions, and isolation structures, such as shallow trench isolation (STI) structures (not shown). The first device region 103 shown in FIG. 1A are merely examples, and other structures may be formed in the first device region 103. In the first device region 103, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed on the first semiconductor substrate 102. The functions of the devices may include memory, processors, sensors, amplifiers, power distribution, input/output circuitry, or the like.

Referring to FIG. 1A, the first interconnect structure 104 is formed over the first semiconductor substrate 102. In detail, the first interconnect structure 104 includes a first insulating material 106 and a plurality of first metal features 108. The first metal features 108 are formed in the first insulating material 106 and electrically connected with each other. A portion of the first metal features 108, such as top metal features 108a and 108b, is exposed by the first insulating material 106. In some embodiments, the first insulating material 106 includes an inner-layer dielectric (ILD) layer on the first semiconductor substrate 102, and at least one inter-metal dielectric (IMD) layer over the inner-layer dielectric layer. In some embodiments, the first insulating material 106 includes silicon oxide, silicon oxynitride, silicon nitride, low dielectric constant (low-k) materials or a combination thereof. In some alternatively embodiments, the first insulating material 106 may be a single layer or multiple layers. In some embodiments, the first metal features 108 include plugs and metal lines. The plugs may include contacts formed in the inner-layer dielectric layer, and vias formed in the inter-metal dielectric layer. The contacts are formed between and in connect with the substrate 102 and a bottom metal line. The vias are formed between and in connect with two metal lines. The first metal features 108 may be made of tungsten (W), copper (Cu), copper alloys, aluminum (Al), aluminum alloys, or a combination thereof. In some alternatively embodiments, a barrier layer (not shown) may be formed between the first metal features 108 and the first insulating material 106 to prevent the material of the first metal features 108 from migrating to the first device region 103. A material of the barrier layer includes tantalum, tantalum nitride, titanium, titanium nitride, cobalt-tungsten (CoW) or a combination thereof, for example.

Referring to FIG. 1A, the first passivation layer 110 is formed over the first interconnect structure 104. The first passivation layer 110 covers the first insulating material 106 and the top metal features 108a. Further, a portion of the top metal features 108b is covered by the first passivation layer 110, and another portion of the top metal features 108b is exposed by the first passivation layer 110, so that the another portion of the top metal features 108b may be electrically connected with the to-be-formed first test pad 112. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like.

Referring to FIG. 1A, the first test pad 112 is formed over the first passivation layer 110 and extends to cover the top metal features 108b. A material of the first test pad 112 is different from the material of the first metal features 108. In some embodiments, the material of the first test pad 112 is softer than the material of the first metal features 108. In some embodiments, the first test pad 112 includes a metal material, such as aluminum, copper, nickel, gold, silver, tungsten, or a combination thereof. The first test pad 112 may be formed by depositing a metal material layer through a suitable process such as electro-chemical plating process, CVD, atomic layer deposition (ALD), PVD or the like, and then patterning the metal material layer.

It should be noted that the first die 100 is a known good die (KGD). That is, a die performance test is conducted to the first test pad 112 of the first die 100 to identify or select known good die. In some embodiments, the die performance test is conducted by using a die performance probe (not shown) inserted into the first test pad 112. A first probe mark 114 is formed at the upper portion of the first test pad 112 after the die performance test is performed. The first probe mark 114 may be formed over the first passivation layer 110, the top metal features 108b or a combination thereof. In some embodiments, the first probe mark 114 includes a first concave portion 114a, a first protrusion 114b, and a first flat portion 114c. The first protrusion 114b is located between the first concave portion 114a and the first flat portion 114c. The first concave portion 114a is located in the first protrusion 114b. In some embodiments, the first protrusion 114b may be a ring structure which surrounds the first concave portion 114a. The first protrusion 114b is surrounded by the first flat portion 114c. In some embodiments, the first protrusion 114b may have a single height H1. The height H1 is a height difference between the first flat portion 114c and the first protrusion 114b. In some other embodiments, the first protrusion 114b may have the height H1 and a height H2. The height H1 is a maximum height difference between the first flat portion 114c and the first protrusion 114b, and the height H2 is a minimum height difference between the first flat portion 114c and the first protrusion 114b. In some exemplary embodiments, the height difference H1 is 0.1 μm to 1.5 μm, and the height difference H2 is 0.1 μm to 1.0 μm. In some embodiments, a bottom surface of the first concave portion 114a is lower than a top surface of the first flat portion 114c.

Figure 1B:
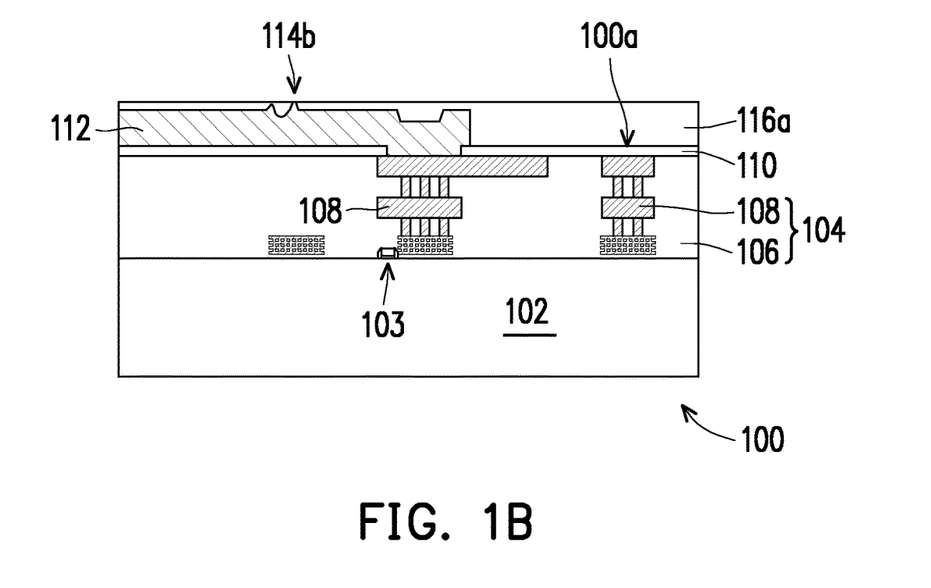
Figure 1C:
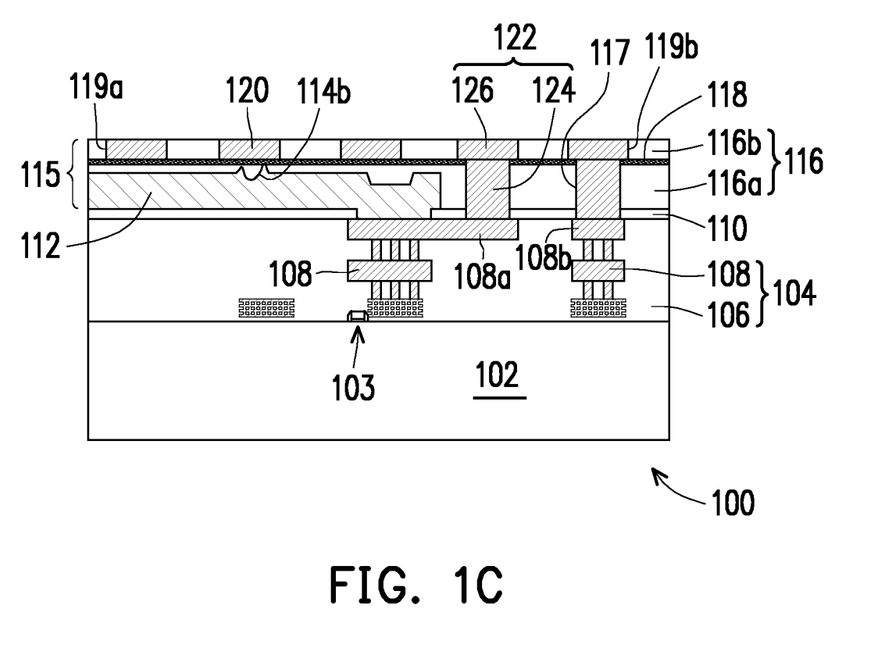

Referring to FIG. 1B and FIG. 1C, a first bonding structure 115 is formed over a front side 100a of the first die 100. In detail, as shown in FIG. 1B, after the first die 100 is identified as the known good die, a bonding dielectric material 116a (or referred as a first bonding dielectric material) is disposed over the front side 100a of the first die 100. The bonding dielectric material 116a covers and is in contact with the first test pad 112 and the first passivation layer 110. In some embodiments, the bonding dielectric material 116a includes silicon oxide, silicon nitride, polymer or a combination thereof. The bonding dielectric material 116a is formed by depositing a dielectric material through a suitable process such as spin coating, CVD or the like, and then performing a planarization process on the dielectric material. In some embodiments, the planarization process includes a CMP process, an etching back process, or a combination thereof. In some embodiments, during the planarization process, a portion of the dielectric material is removed, and the topmost first protrusion 114b is also removed. That is, the first protrusion 114b and the bonding dielectric material 116a are at substantially the same level as shown in FIG. 1B. In some other embodiments, during the planarization process, a portion of the dielectric material is removed, and the first protrusion 114b is not removed, and still covered by the dielectric material.

Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 1B, tops of the first protrusion 114b and the bonding dielectric material 116a are substantially coplanar.

Referring to FIG. 1C, a first blocking layer 118 is blanketly formed to cover the bonding dielectric material 116a and the first protrusion 114b of the first test pad 112. In some embodiments, the first blocking layer 118 includes a dielectric material, such as silicon oxide, silicon nitride, silicon oxynitride, or a combination thereof, and is formed by a suitable process such as CVD, ALD, or the like. In some embodiments, a thickness of the first blocking layer 118 is 0.1 μm to 0.5 μm.

Referring to FIG. 1C, another bonding dielectric material 116b (or referred as a second bonding dielectric material) is formed over the first blocking layer 118. That is, the first blocking layer 118 is disposed between the bonding dielectric materials 116a and 116b. A material of the first blocking layer 118 is different from that of the bonding dielectric materials 116a and 116b. The bonding dielectric materials 116a and 116b may be referred as a first bonding dielectric layer 116. The material and forming method of the bonding dielectric material 116b are similar to the material and forming method of the bonding dielectric material 116a. Thus, details thereof are omitted here.

Referring to FIG. 1C, a first dummy metal layer 120 and a first bonding metal layer 122 are formed in the first bonding dielectric layer 116. The first dummy metal layer 120 is formed over the first blocking layer 118. The first dummy metal layer 120 is corresponding to the first test pad 112. The first dummy metal layer 120 is disposed in the bonding dielectric material 116b and exposed by the bonding dielectric material 116b. Herein, when elements are described as "dummy", the elements are electrically floating or electrically isolated from other elements. For example, as shown in FIG. 1C, the first dummy metal layer 120 is electrically floating. In some embodiments, the first dummy metal layer 120 is formed by a single damascene method.

The first bonding metal layer 122 is formed aside the first dummy metal layer 120 and formed in the bonding dielectric material 116a and 116b, the first blocking layer 118, and the first passivation layer 110. In some embodiments, the first bonding metal layer 122 includes a via plug 124 and a conductive line 126. In some other embodiments, the conductive line 126 is a via plug having a larger area than the via plug 124.

The via plug 124 penetrates through the first blocking layer 118, the bonding dielectric material 116a and the first passivation layer 110, and is in connect with the first metal features 108. The conductive line 126 is disposed over the first blocking layer 118 and connected with the via plug 124. In other words, the conductive line 126 is electrically connected to the first metal features 108 through the via plug 124. In some embodiment, the first dummy metal layer 120 and the conductive line 126 (or the first bonding metal layer 122) are at substantially the same level. That is, tops of the first dummy metal layer 120 and the conductive line 126 (or the first bonding metal layer 122) are substantially coplanar with the top surface of the bonding dielectric material 116b. In some embodiments, the first bonding metal layer 122 is formed by a dual damascene method.

In some embodiments, the first dummy metal layer 120 may include copper, copper alloys, nickel, aluminum, tungsten, or a combination of thereof. The first bonding metal layer 122 may include copper, copper alloys, nickel, aluminum, tungsten, or a combination of thereof. In some embodiments, the material of the first dummy metal layer 120 and the material of the first bonding metal layer 122 may be the same. In some alternatively embodiments, the material of the first dummy metal layer 120 may be different from the material of the first bonding metal layer 122.

In some embodiments, the first dummy metal layer 120 and the conductive line 126 are formed at the same time. In some other embodiments, the first dummy metal layer 120 and the conductive line 126 are successively formed. The first dummy metal layer 120 and the first bonding metal layer 122 are formed by a trench first process, a via hole first process, or a self-aligned process.

In some embodiments, the first dummy metal layer 120 and the first bonding metal layer 122 are formed as following steps (referred as the trench first process). The dielectric layer 116b is patterned by lithography and etching processes to form trenches 119a and 119b therein. The trenches 119a are corresponding to the first test pad 112. The trenches 119b are corresponding to the top metal features 108a and 108b. During the etching process, the first blocking layer 118 serves as an etching stop layer, and thus the first blocking layer 118 is exposed by the trenches 119a and 119b. Next, a portion of the first blocking layer 118 exposed by the trenches 119b and the underlying bonding dielectric material 116a and the first passivation layer 110 are patterned by lithography and etching processes to form via holes 117 therein. The via holes 117 expose the top metal features 108a and 108b. Thereafter, a conductive material layer is formed on the dielectric layer 116b, and fills into the trenches 119a and 119b, and the via holes 117. The conductive material layer on the bonding dielectric material 116b is then removed by a planarization process such as a CMP process, and thus the first dummy metal layer 120 is formed in the trench 119a, and the via plug 124 and the conductive line 126 are formed in the via hole 117 and the trench 119b respectively.

In some other embodiments, the first dummy metal layer 120 and the first bonding metal layer 122 are formed as following steps (referred as a via hole first process). The bonding dielectric materials 116a and 116b, the first blocking layer 118 and the first passivation layer 110 are patterned by lithography and etching processes to form via holes 117. Next, the bonding dielectric material 116b is patterned by lithography and etching processes to form trenches 119a and 119b therein. During the etching process, the first blocking layer 118 is serves as an etching stop layer, and thus the first blocking layer 118 is exposed by the trenches 119a and 119b. Thereafter, the conductive material layer is formed and the planarization process is performed.

In alternative embodiments, the first dummy metal layer 120 and the first bonding metal layer 122 are formed as following steps (referred as the self-aligned process). After the bonding dielectric material 116a is formed, the first blocking layer 118 is formed and patterned by lithography and etching processes to form via hole patterns therein. Next, the bonding dielectric material 116b is formed over the first blocking layer 118 with the via hole patterns. The bonding dielectric material 116b fills into the via hole patterns of the first blocking layer 118 and is in contact with the bonding dielectric material 116a. Thereafter, a patterned mask with trench patterns is formed on the bonding dielectric material 116b by a lithography process, some of the trench patterns are corresponding to the via hole patterns of the first blocking layer 118. Thereafter, an etching process is performed on the bonding dielectric material 116b by using the first blocking layer 118 as an etching stop layer, so that the trench 119a and 119b are formed. At the same time, the bonding dielectric material 116a is etched by using the first blocking layer 118 with the via hole patterns as a hard mask, so that via hole 117 is formed in the bonding dielectric material 116a and self-aligned with the trench 119b. Thereafter, the conductive material layer is formed and the planarization process is performed.

It should be noted that the first dummy metal layer 120 is electrically isolated from the first test pad 112 by the first blocking layer 118. Therefore, the leakage current because of the electrical connection from one test pad to another test pad via the dummy metal layer is able to be avoided and the electrical short could be prevented. As a result, the reliability of the device is accordingly enhanced.

Figure 1D:
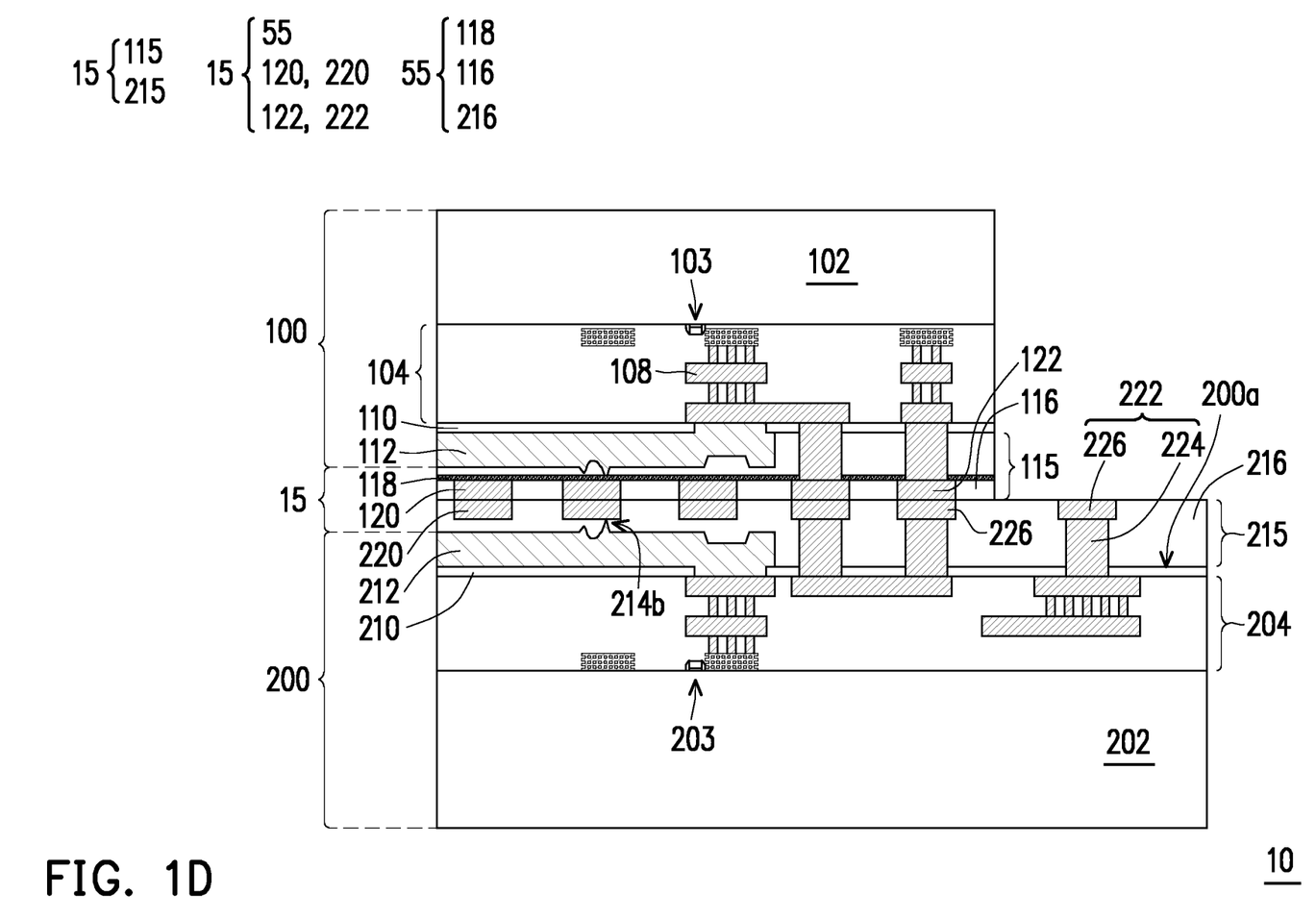

Referring to FIG. 1D, a second die 200 is provided. The second die 200 may be an application-specific integrated circuit (ASIC) chip, an analog chip, a sensor chip, a wireless and radio frequency chip, a voltage regulator chip or a memory chips, for example. The second die 200 and the first die 100 may be the same types of dies or different types of dies. In some embodiments, the second die 200 may be an active component or a passive component.

In some embodiments, the second die 200 is similar to the first die 100. That is, the second die 200 includes a second semiconductor substrate 202, a second device region 203, a second interconnect structure 204, a second passivation layer 210, and a second test pad 212. The arrangement, material and forming method of the second die 200 are similar to the arrangement, material and forming method of the first die 100. Thus, details thereof are omitted here. A difference therebetween lies in that the size of the second die 200 is greater than the size of the first die 100. Herein, the term "size" is referred to the length, width, or area. For example, as shown in FIG. 1D, the length of the second die 200 is greater than the length of the first die 100.

Referring to FIG. 1D, a second bonding structure 215 is formed over a front side 200a of the second die 200. In detail, the second bonding structure 215 includes a second bonding dielectric layer 216, a second dummy metal layer 220, and a second bonding metal layer 222. The second dummy metal layer 220 is formed in the second bonding dielectric layer 216 by a single damascene method. The second dummy metal layer 220 is corresponding to the second test pad 212. The second bonding metal layer 222 is formed aside the second dummy metal layer 220 and formed in the second bonding dielectric layer 216 by a dual damascene method. The second bonding metal layer 222 includes a via plug 224 and a conductive line 226 disposed over the via plug 224. A difference between the first bonding structure 115 and the second bonding structure 215 lies in that no blocking layer disposed in the second bonding structure 215. Therefore, a second protrusion 214b of the second test pad 212 extends into the second bonding structure 215. In some embodiments, the second protrusion 214b of the second test pad 212 is connected to the second dummy metal layer 220. In some other embodiments, the second protrusion 214b of the second test pad 212 is not connected to the second dummy metal layer 220. After the second bonding structure 215 is formed, as shown in FIG. 1D, the second dummy metal layer 220 and the conductive line 226 (or the second bonding metal layer 222) are at substantially the same level.

Referring to FIG. 1D, the first die 100 is further turned upside down and mounted onto the second die 200. In detail, the first die 100 and the second die 200 are face-to-face bonded together via the first bonding structure 115 and the second bonding structure 215. In some embodiments, before the first die 100 is bonded to the second die 200, the first bonding structure 115 and the second bonding structure 215 are aligned, such that the first dummy metal layer 120 may be bonded to the second dummy metal layer 220, the first bonding metal layer 122 may be bonded to the second bonding metal layer 222, and the first bonding dielectric layer 116 may be bonded to the second bonding dielectric layer 216. In some embodiments, the alignment of the first bonding structure 115 and the second bonding structure 215 may be achieved by using an optical sensing method. After the alignment is achieved, the first bonding structure 115 and the second bonding structure 215 are bonded together by a hybrid bonding to form a hybrid bonding structure 15. The hybrid bonding structure 15 includes the first dummy metal layer 120, the second dummy metal layer 220, the first bonding metal layer 122, the second bonding metal layer 222, and a bonding insulating layer 55. The bonding insulating layer 55 includes the first blocking layer 118, the first bonding dielectric layer 116 and the second bonding dielectric layer 216.

The first bonding structure 115 and the second bonding structure 215 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 1D, the hybrid bonding structure 15 includes the first dummy metal layer 120 and the second dummy metal layer 220 bonded by metal-to-metal bonding, the first bonding metal layer 122 and the second bonding metal layer 222 bonded by metal-to-metal bonding, and the first bonding dielectric layer 116 and the second bonding dielectric layer 216 bonded by non-metal-to-non-metal bonding.

Figure 1E:
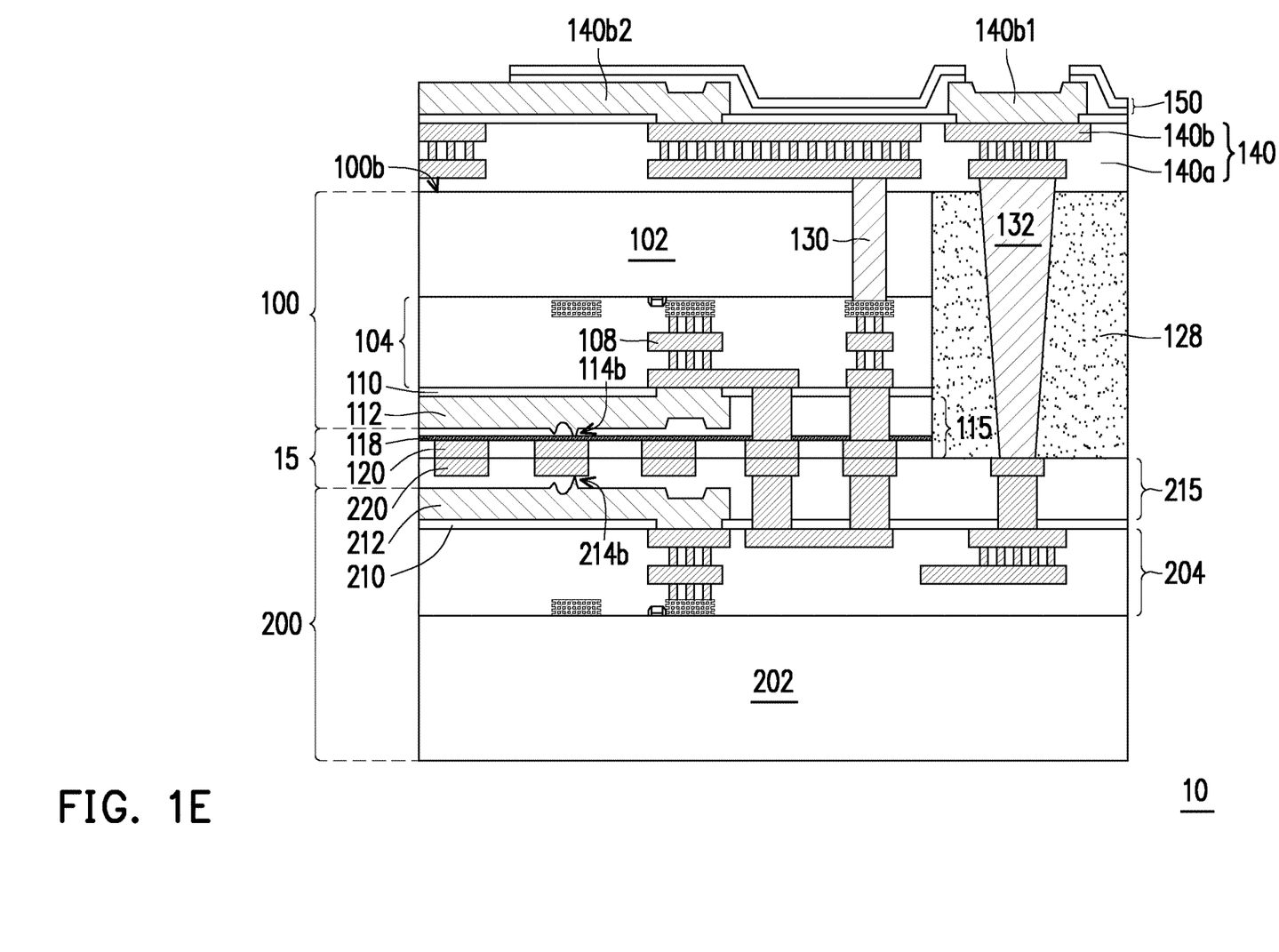

Referring to FIG. 1E, an insulating encapsulation 128 is formed aside the first die 100. More specifically, the insulating encapsulation 128 is formed around the first die 100 and overlays the front side 200a of the second die 200. In some embodiments, a material of the insulating encapsulation 128 includes a molding compound. The molding compound may include a resin and a filler. In some alternatively embodiments, a material of the insulating encapsulation 128 includes an oxide or a nitride, such as silicon oxide, silicon nitride or a combination thereof. The insulating encapsulation 128 may be formed by spin-coating, lamination, deposition or the like. For example, the insulating encapsulation 128 may be formed by firstly forming an encapsulant material (not shown) over and covering the first die 100. Thereafter, the encapsulant material over the first chip 100 is removed by a planarization process such as a CMP process. In some embodiments, a portion of the encapsulant material is removed so that a back side 100b of the first die 100 is exposed after planarization process. Thus, the back side 100b of the first die 100 is substantially planar with a top surface of the insulating encapsulation 128.

Referring to FIG. 1E, after the insulating encapsulation 128 is formed, at least one through-substrate via (TSV) 130 is formed. The TSV 130 penetrates the first semiconductor substrate 102 and is electrically connected with the first metal features 108 of the first interconnect structure 104. The TSV 130 is used to provide electrical connections between the first dies 100 and the to-be-formed redistribution circuit structure 140. In some embodiments, the TSV 130 includes a conductive via. The conductive via is made of copper, copper alloys, aluminum, aluminum alloys, or combinations thereof. In some other embodiments, the TSV 130 further includes a diffusion barrier layer (not shown) surround the conductive via. The diffusion barrier layer is made of Ta, TaN, Ti, TiN, CoW or a combination thereof, and may be formed by a suitable process such as electro-chemical plating process, CVD, atomic layer deposition (ALD), PVD or the like.

Referring to FIG. 1E, at least one through dielectric via (TDV) 132 is formed in the insulating encapsulation 128 to electrically connected with the second interconnect structure 204 and the to-be-formed redistribution circuit structure 140. In some embodiments, the TDV 132 includes a conductive via. The conductive via is made of copper, copper alloys, aluminum, aluminum alloys, or combinations thereof. In some other embodiments, the TDV 132 further includes a diffusion barrier layer (not shown) surround the conductive via. The diffusion barrier layer is made of Ta, TaN, Ti, TiN, CoW or a combination thereof, and may be formed by a suitable process such as electro-chemical plating process, CVD, atomic layer deposition (ALD), PVD or the like.

Referring to FIG. 1E, after the TSV 130 and the TDV 132 are formed, a redistribution circuit structure 140 is formed over the back side 100b of the first die 100 and over the insulating encapsulation 128. The redistribution circuit structure 140 includes a plurality of dielectric layers 140a and a plurality of redistribution conductive layers 140b stacked alternately. One portion of the redistribution conductive layers 140b is electrically connected with the TSV 130. Another portion of the redistribution conductive layers 140b is electrically connected with the TDV 132. Furthermore, the topmost redistribution conductive layer 140b includes a plurality of pads. In some embodiments, the above-mentioned pads include a plurality of bonding pads 140b1 for mounting conductive connectors (e.g., metal pillars, μ-bumps or a combination thereof) bumps, and/or at least one test pad 140b2 for conducting a die backside performance test. The number of the bonding pads 140b1 and the test pads 140b2 is not limited in this disclosure. The material of the bonding pads 140b1 includes a metal or a metal alloy. The bonding pad 140b1 is, for example, aluminum, copper, nickel, or alloys thereof. The material of the test pad 140b2 may be the same as or different from that of the bonding pad 140b1. In some embodiments, the test pad 140b2 includes a metal material, such as aluminum, copper, nickel, gold, silver, tungsten, or a combination thereof.

Referring to FIG. 1E, after a passivation layer 150 is formed over the redistribution circuit structure 140 and partially covers the bonding pads 140b1 and the test pads 140b2, a die stack structure 10 is accomplished. The passivation layer 150 includes silicon oxide, silicon nitride, benzocyclobutene (BCB) polymer, polyimide (PI), polybenzoxazole (PBO) or a combination thereof and is formed by a suitable process such as spin coating, CVD or the like.

Referring to FIGS. 1C, 1D and 1E, the die stack structure 10 includes the first die 100 and the second die 200 which are face-to-face bonded together by the hybrid bonding structure 15. The hybrid bonding structure 15 includes the first dummy metal layer 120 and the second dummy metal layer 220 bonded by metal-to-metal bonding, the first bonding metal layer 122 and the second bonding metal layer 222 bonded by metal-to-metal bonding, and the first bonding dielectric layer 116 and the second bonding dielectric layer 216 bonded by non-metal-to-non-metal bonding. The hybrid bonding structure 15 further include the first blocking layer 118. The first blocking layer 118 is formed in the first bonding dielectric layer 116, and disposed between the first protrusion 114b of the first test pad 112 and the first dummy metal layer 120. The first blocking layer 118 is able to prevent the first protrusion 114b of the first test pad 112 from extending into the first dummy metal layer 120, so that the first test pad 112 is electrically isolated from the second test pad 212. Therefore, the leakage current because of the electrical connection from one test pad to another test pad via the dummy metal layer is able to be avoided and the electrical short could be prevented. As a result, the reliability of the die stack structure 10 is accordingly enhanced.

Figure 2:
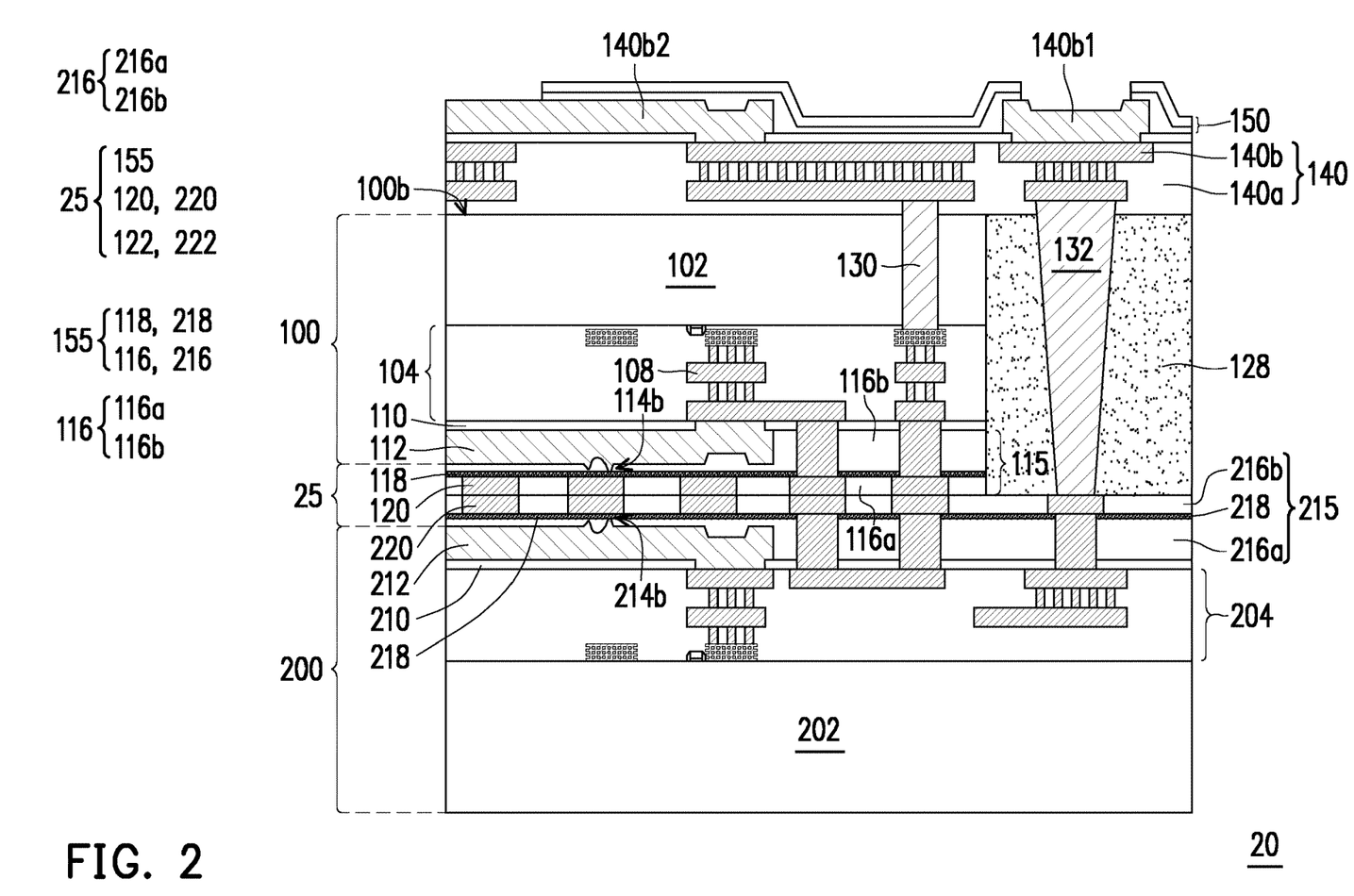
FIG. 2 is a cross-sectional view of a die stack structure in accordance with a second embodiment.

FIG. 2 is a cross-sectional view of a die stack structure in accordance with a second embodiment.

Referring to FIG. 2, a die stack structure 20 of the second embodiment is similar to the die stack structure 10 of the first embodiment. A difference therebetween lies in that a second blocking layer 218 disposed in the second bonding structure 215 of the hybrid bonding structure 25 to further prevent the leakage current between the first die 100 and the second die 200. The second blocking layer 218 is formed in the second bonding dielectric layer 216 and between the second protrusion 214b of the second test pad 212 and the second dummy metal layer 220. The second bonding dielectric layer 216 includes a third bonding material 216a and a fourth bonding material 216b. The second blocking layer 218 is disposed between the third bonding material 216a and the fourth bonding material 216b. Therefore, the second protrusion 214b of the second test pad 212 and the second dummy metal layer 220 are not in contact with each other, but separated and electrically isolated by the second blocking layer 218 therebetween.

In this embodiment, the hybrid bonding structure 25 includes the first dummy metal layer 120, the second dummy metal layer 220, the first bonding metal layer 122, the second bonding metal layer 222, and a bonding insulating layer 155. The bonding insulating layer 155 includes the first blocking layer 118, the second blocking layer 218, the first bonding dielectric layer 116 and the second bonding dielectric layer 216.

In some other embodiments, the die stack structure 10 includes the first die 100 and the second die 200 which are face-to-face bonded together by the hybrid bonding structure. The hybrid bonding structure includes the second blocking layer 218 and without the first blocking layer 118, that is, the bonding insulating layer may include the first bonding dielectric layer 116 and the second bonding dielectric layer 216 with the second blocking layer 218 therein, and no blocking layer is formed in the first bonding dielectric layer 116.

Figure 3:
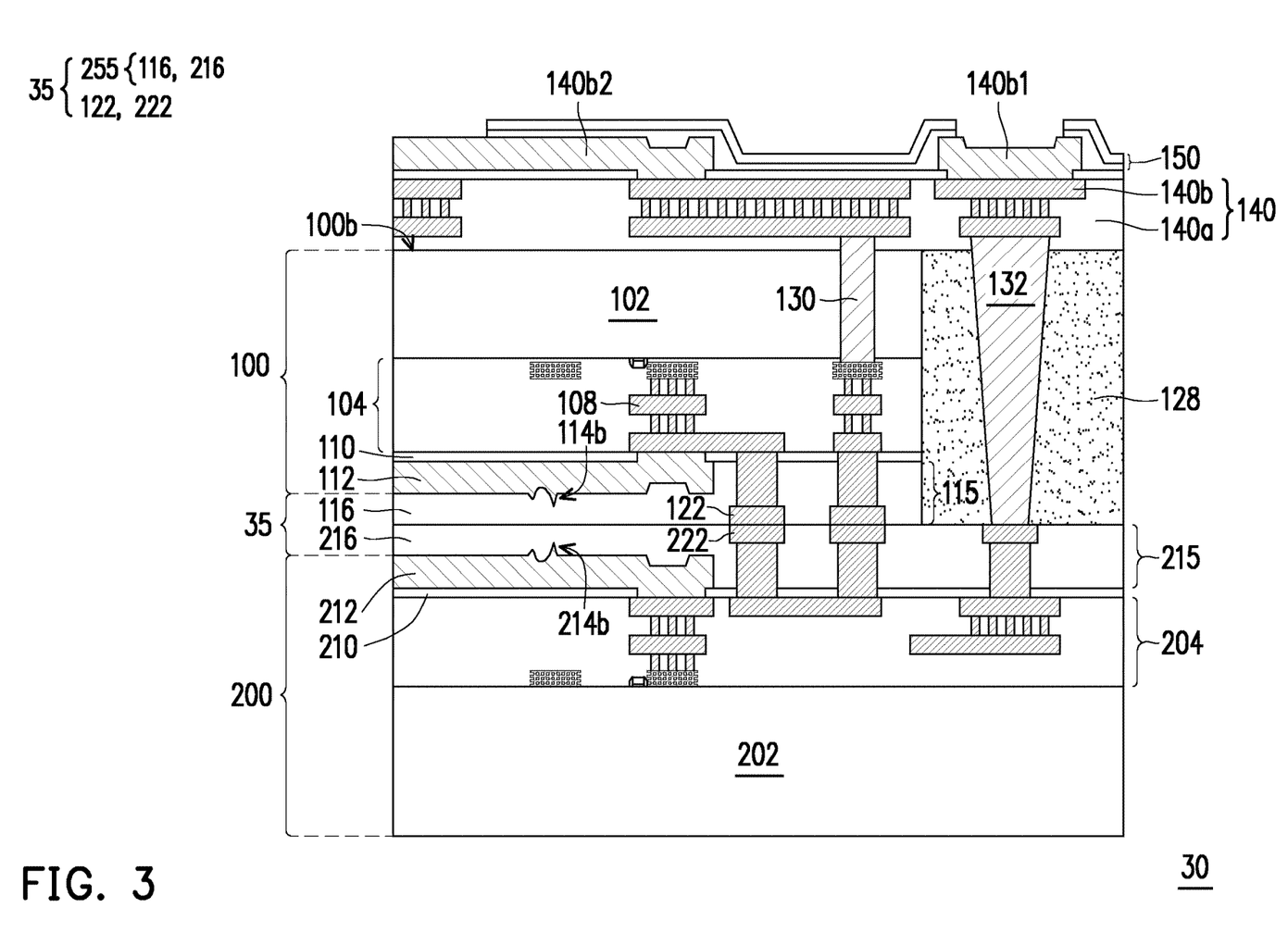
FIG. 3 is a cross-sectional view of a die stack structure in accordance with a third embodiment.

FIG. 3 is a cross-sectional view of a die stack structure in accordance with a third embodiment.

Referring to FIG. 3, a die stack structure 30 of the third embodiment is similar to the die stack structure 10 of the first embodiment. A difference therebetween lies in that no dummy metal layer and no blocking layer exist in the hybrid bonding structure 35 of the die stack structure 30. In other words, a top surface and sidewalls of the first test pad 112 is covered by and in contact with the first bonding dielectric layer 116, and a top surface and sidewalls of the second test pad 212 is covered by and in contact with the second bonding dielectric layer 216.

Therefore, the first test pad 112 and the second test pad 212 are electrically isolated from each other by the first bonding dielectric layers 116 and the second bonding dielectric layer 216 of the hybrid bonding structure 35. In other words, the region between the first protrusion 114b of the first test pad 112 and the second protrusion 214b of the second test pad 212 is metal-free.

In this embodiment, the hybrid bonding structure 35 includes the first bonding metal layer 122, the second bonding metal layer 222, and a bonding insulating layer 255. The bonding insulating layer 255 includes the first bonding dielectric layer 116 and the second bonding dielectric layer 216.

In the embodiments above, one first die 100 is bonded to one second die 200, but the disclosure is not limited thereto. In some other embodiments, two or more dies may be bonded to a larger die, and the dies may be the same types of dies or different types of dies.

Figure 4:
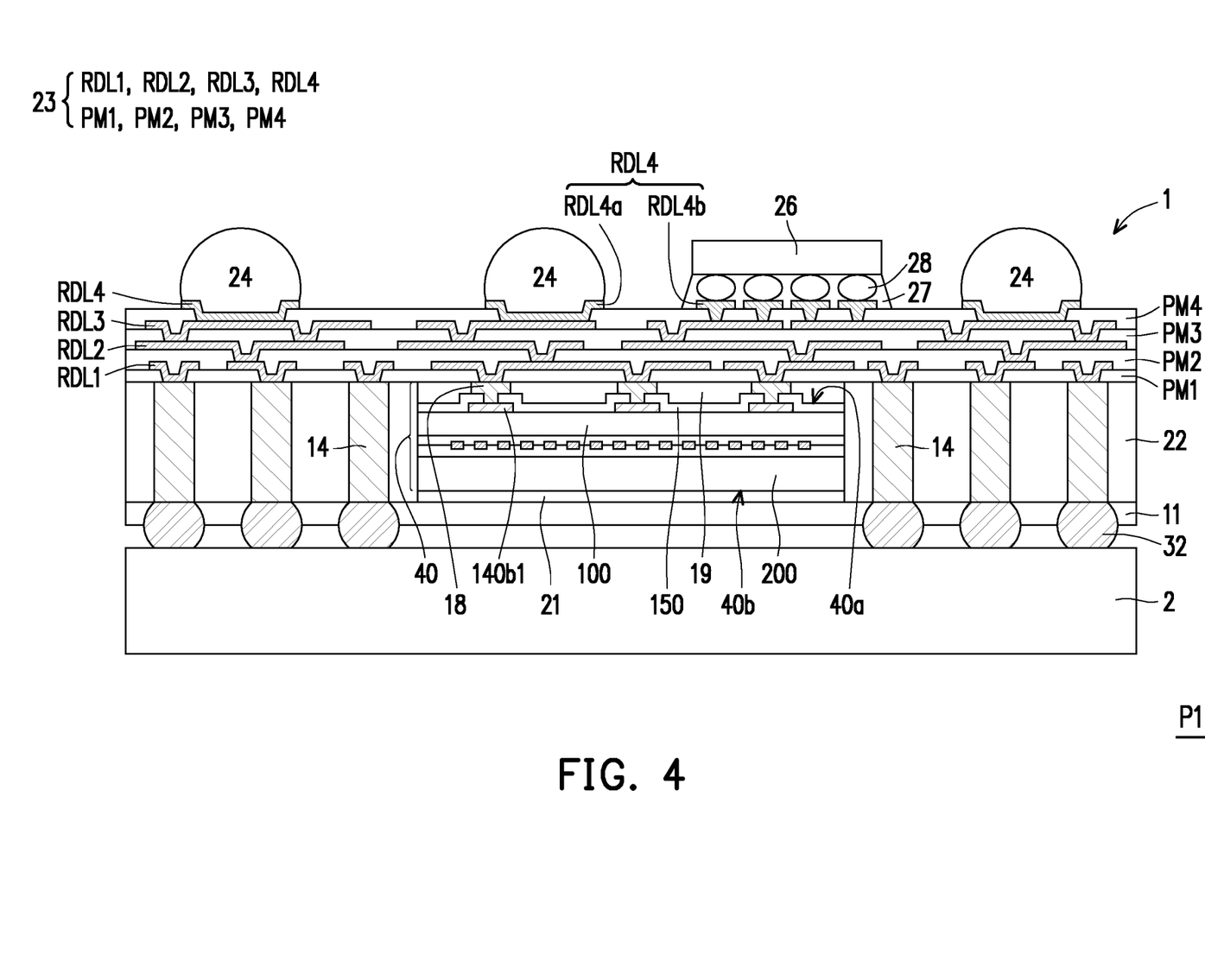
FIG. 4 is a cross-sectional view of a package in accordance with one embodiment.

FIG. 4 is a cross-sectional view of a package in accordance with one embodiment.

Referring to FIG. 4, a die stack structure 40 having a first surface 40a and a second surface 40b opposite to each other is mounted over a dielectric layer 11 by an adhesive layer 21. The first surface 40a of the die stack structure 40 is toward upward, while the second surface 40b of the die stack structure 40 is toward the dielectric layer 11. In some embodiments, the die stack structure 40 may be one of the die stack structure 10, 20, and 30. The die stack structure 40 includes the first die 100 and the second die 200 which are face-to-face bonded together. In the embodiment, the die stack structure 40 further includes a plurality of connectors 18 and a passivation layer 19. The connectors 18 are formed over and electrically connected to the bonding pads 140b1 not covered by the passivation layer 150. The connector 18 includes solder bumps, gold bumps, copper bumps, copper posts, copper pillars, or the like. The passivation layer 19 is formed over the passivation layer 150 and aside the connectors 18 to cover the sidewalls of the connectors 18.

Referring to FIG. 4, an insulating encapsulation 22 is formed aside the die stack structure 40 to encapsulate the die stack structure 40. A plurality of conductive posts 14 are formed in the insulating encapsulation 22 and surround the die stack structure 40. A redistribution layer (RDL) structure 23 is formed over and electrically connected to the die stack structure 40 and the conductive posts 14. In some embodiments, the RDL structure 23 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In other words, the redistribution layer RDL1 penetrates through the polymer layer PM1 and is electrically connected to the connectors 18 of the die stack structure 40 and the conductive posts 14. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials include metal such as copper, nickel, titanium, a combination thereof or the like, and are formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL2, RDL3 and RDL4 respectively includes a plurality of vias and a plurality of traces connected to each other. The vias connects the traces, and the traces are respectively located on the polymer layers PM1, PM2, PM3 and PM 4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred as under-ball metallurgy (UBM) layer for ball mounting. The redistribution layer RDL4b may be micro bump for connecting to an integrated passive device (IPD) 26 formed in the subsequent process.

Thereafter, a plurality of connectors 24 are formed over and electrically connected to the redistribution layer RDL4a of the redistribution layer structure 23. In some embodiments, the connectors 24 are made of a conductive material with low resistivity, such as Sn, Pb, Ag, Cu, Ni, Bi or an alloy thereof, and are formed by a suitable process such as evaporation, plating, ball drop, or screen printing. An IPD 26 is formed over and electrically connected to the redistribution layer RDL4b of the redistribution layer structure 23 through the solder bumps 28. The IPD 26 may be a capacitor, a resistor, an inductor or the like, or a combination thereof. The number of the IPD 26 is not limited to that is shown in FIG. 4, but may be adjusted according to the design of the product. An underfill layer 27 is formed between the IPD 26 and the polymer layer PM4, and surrounds and covers the exposed RDL4b, the solder bumps 28 and the bottom surface of the IPD 26.

As shown in FIG. 4, the dielectric layer 11 is then patterned such that lower surfaces of the conductive posts 14 is exposed by the dielectric layer 11. After the conductive terminals 32 are formed over the lower surfaces of the conductive posts 14 respectively, an integrated fan-out package 1 having dual-side terminals is accomplished. Another package 2 is then provided. In some embodiments, the package 2 is, for example, a memory device. The package 2 is stacked over and is electrically connected to the integrated fan-out package 1 through the conductive terminals 32 such that a package-on-package (POP) structure P1 is fabricated.

Figure 5:
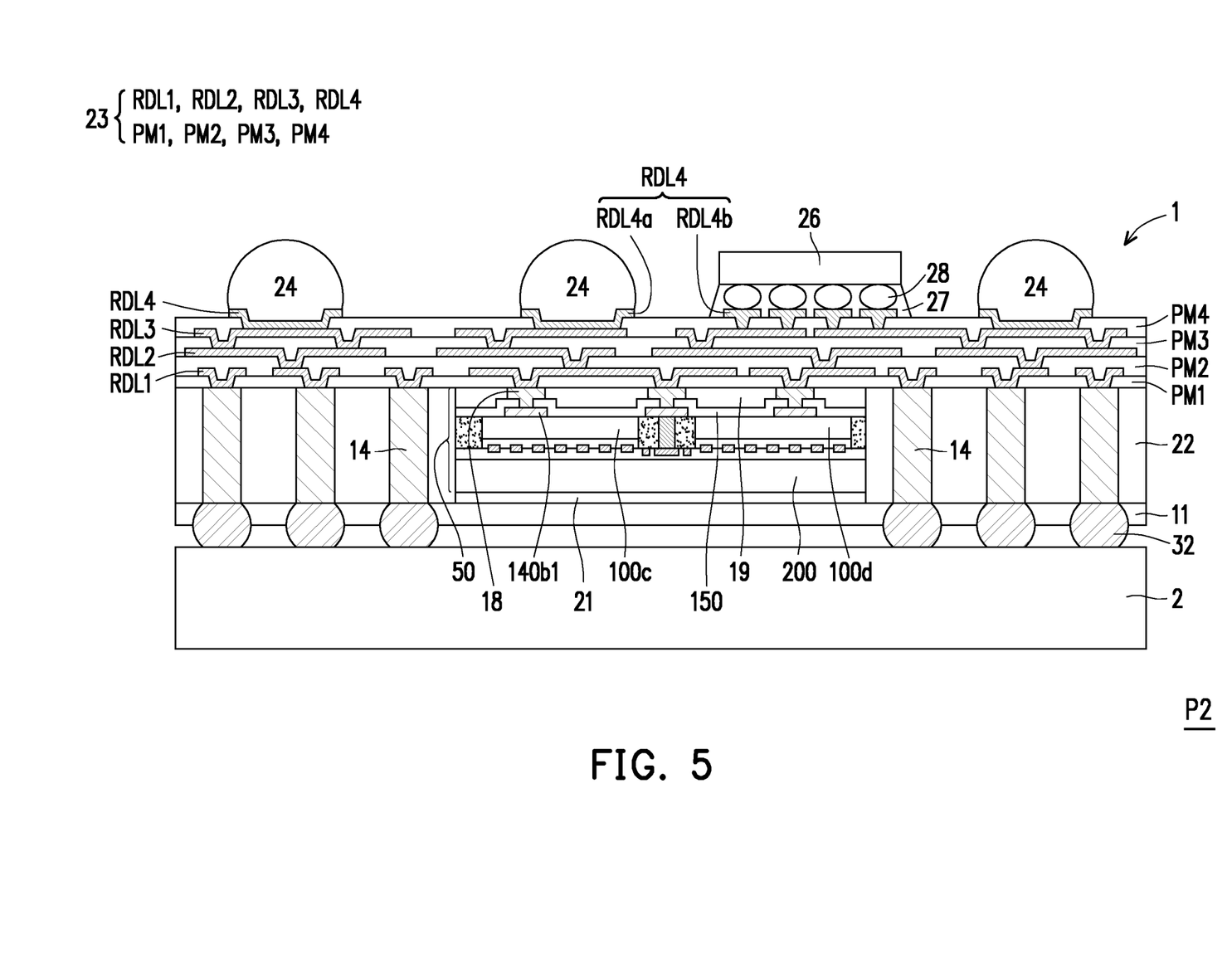
FIG. 5 is a cross-sectional view of a package in accordance with another embodiment.

FIG. 5 is a cross-sectional view of a package in accordance with another embodiment.

Referring to FIG. 5, a POP structure P2 of another embodiment is similar to the POP structure P1 of one embodiment. A difference therebetween lies in that a die stack structure 50 includes a plurality of first dies 100c and 100d arranged in parallel over the second die 200. The number of the first dies 100c and 100d is not limited in this disclosure.

Figure 6:
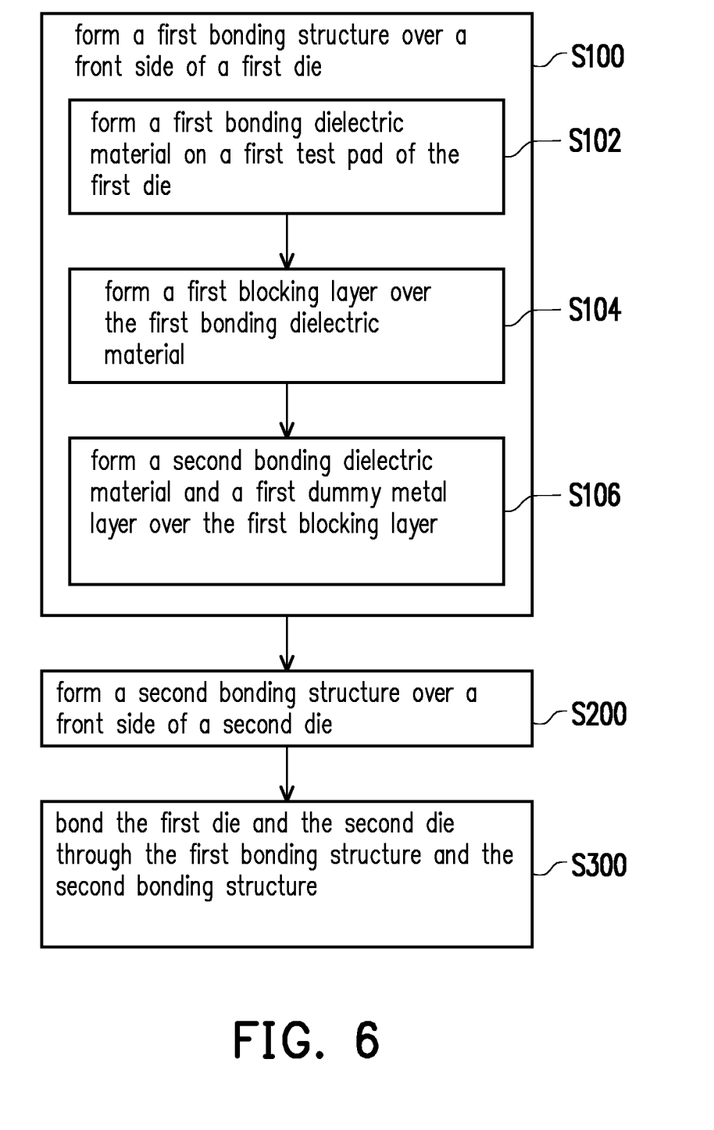
FIG. 6 is a flow chart of a method of manufacturing a die stack structure according to some embodiments of the disclosure.

FIG. 6 is a flow chart of a method of manufacturing a die stack structure according to some embodiments of the disclosure. Referring to FIG. 6, in step S100, a first bonding structure is formed over a front side of a first die. The step S100 includes the steps S102, S104 and S106. In step S102, a first bonding dielectric material is formed on a first test pad of the first die. In step S104, a first blocking layer is formed over the first bonding dielectric material. In step S106, a second bonding dielectric material and a first dummy metal layer is formed over the first blocking layer. Thereafter, in step S200, a second bonding structure is formed over a front side of a second die. In step S300, the first die and the second die are bonded through the first bonding structure and the second bonding structure.

According to some embodiments, a method of manufacturing a die stack structure includes the following steps. A first bonding structure is formed over a front side of a first die. The method of forming the first bonding structure includes the following steps. A first bonding dielectric material is formed on a first test pad of the first die. A first blocking layer is formed over the first bonding dielectric material. A second bonding dielectric material and a first dummy metal layer are formed over the first blocking layer. The first dummy metal layer and the first test pad are electrically isolated from each other by the first blocking layer. Thereafter, a second bonding structure is formed over a front side of a second die. The first die and the second die are bonded through the first bonding structure and the second bonding structure.

According to some embodiments, a method of manufacturing a die stack structure, comprising: performing a first die performance test on a first test pad of a first die, so that the first test pad has a first probe mark comprising: a first concave portion; a first protrusion surrounding the first concave portion; and a first flat portion surrounding the first protrusion, wherein a plane along a top surface of the first flat portion is between a bottommost portion of the first concave portion and a topmost portion of the first protrusion; forming a first bonding dielectric material encapsulating the first test pad; performing a first planarization process on the first bonding dielectric material to expose the first protrusion; forming a first blocking layer on the first bonding dielectric material to contact the first protrusion; forming a second bonding dielectric material on the first blocking layer, wherein a material of the first blocking layer is different from the first and second bonding dielectric materials; forming a first dummy metal layer in the second bonding dielectric material and on the first blocking layer According to some embodiments, a method of manufacturing a die stack structure, comprising: bonding a first die onto a second die through a hybrid bonding structure, wherein forming the hybrid bonding structure comprises: forming a first bonding structure on a front side of the first die, comprising: forming a first bonding dielectric material on a first test pad of the first die; forming a first blocking layer over the first bonding dielectric material; and forming a second bonding dielectric material over the first blocking layer, wherein a material of the first blocking layer is different from the first and second bonding dielectric materials; and forming a second bonding structure on a front side of the second die, wherein a first bonding metal layer of the first bonding structure and a second bonding metal layer of the second bonding structure are in physical contact with and bonded to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a die stack structure, comprising:
    forming a first bonding structure over a front side of a first die, comprising:
        forming a first bonding dielectric material on a first test pad of the first die, and then performing a planarization process on the first bonding dielectric material to expose a first protrusion of the first test pad while a first concave portion and a first flat portion of the first test pad are covered by the first bonding dielectric material;
        forming a first blocking layer over the first bonding dielectric material; and
        forming a second bonding dielectric material and a first dummy metal layer over the first blocking layer, wherein the first dummy metal layer and the first test pad are electrically isolated from each other by the first blocking layer; and
    forming a second bonding structure over a front side of a second die; and
    bonding the first die and the second die through the first bonding structure and the second bonding structure.

2. The method of claim 1, further comprising performing a first die performance test on the first test pad before the first blocking layer is formed.

3. The method of claim 2, wherein after performing the first die performance test, the first test pad has a first probe mark comprising:
    the first concave portion;
    the first protrusion surrounding the first concave portion; and
    the first flat portion surrounding the first protrusion, wherein a plane along a top surface of the first flat portion is between a bottommost portion of the first concave portion and a topmost portion of the first protrusion.

4. The method of claim 3, wherein the planarization process comprises:
    removing a portion of the first protrusion of the first test pad, and the planarization process is performed before the first blocking layer is formed and after the first die performance test is performed.

5. The method of claim 4, wherein tops of the first protrusion and the first bonding dielectric material are substantially coplanar after the planarization process.

6. The method of claim 1, wherein forming the second bonding dielectric material and the first dummy metal layer comprises:
    forming the second bonding dielectric material on the first blocking layer;
    patterning the second bonding dielectric material with the first blocking layer as an etching stop layer to form a trench; and
    filling the trench with a conductive material.

7. The method of claim 1, wherein bonding the first die and the second die comprises a hybrid bonding.

8. The method of claim 1, wherein forming the second bonding structure comprises:
    forming a third bonding dielectric material on a second test pad of the second die;
    forming a second blocking layer over the third bonding dielectric material; and
    forming a fourth bonding dielectric material and a second dummy metal layer over the second blocking layer, wherein the second dummy metal layer and the second test pad are electrically isolated from each other by the second blocking layer.

9. The method of claim 8, wherein the first dummy metal layer is in physical contact with the second dummy metal layer to bond the first die and the second die together.

10. A method of manufacturing a die stack structure, comprising:
performing a first die performance test on a first test pad of a first die, so that the first test pad has a first probe mark comprising:
a first concave portion;
a first protrusion surrounding the first concave portion; and
a first flat portion surrounding the first protrusion, wherein a plane along a top surface of the first flat portion is between a bottommost portion of the first concave portion and a topmost portion of the first protrusion;
forming a first bonding dielectric material encapsulating the first test pad;
performing a first planarization process on the first bonding dielectric material to expose the first protrusion;
forming a first blocking layer on the first bonding dielectric material to contact the first protrusion;
forming a second bonding dielectric material on the first blocking layer, wherein a material of the first blocking layer is different from the first and second bonding dielectric materials;
forming a first dummy metal layer in the second bonding dielectric material and on the first blocking layer.

11. The method of claim 10, further comprising performing a second die performance test on a second test pad of a second die, so that the second test pad has a second probe mark comprising:
a second concave portion;
a second protrusion surrounding the second concave portion; and
a second flat portion surrounding the second protrusion, wherein a plane along a top surface of the second flat portion is between a bottommost portion of the second concave portion and a topmost portion of the second protrusion.

12. The method of claim 11, further comprising:
forming a third bonding dielectric material encapsulating the second test pad of the second die;
performing a second planarization process on the third bonding dielectric material to expose the second protrusion;
forming a second blocking layer on the third bonding dielectric material to contact the second protrusion;
forming a fourth bonding dielectric material on the second blocking layer, wherein a material of the second blocking layer is different from the third and fourth bonding dielectric materials;
forming a second dummy metal layer in the fourth bonding dielectric material and on the second blocking layer; and
bonding the first die and the second die together by physically contacting the first dummy metal layer onto the second dummy metal layer.

13. The method of claim 12, wherein the first die has an area less than an area of the second die, so that a sidewall of an edge of the first die and a portion of a top surface of the fourth bonding dielectric material are exposed.

14. The method of claim 13, further comprising:
forming an insulating encapsulation overlying the portion of the top surface of the fourth bonding dielectric material, wherein the insulating encapsulation laterally encapsulates and is in contact with the sidewall of the edge of the first die;
forming a redistribution circuit structure on a back side of the first die and on the insulating encapsulation; and
forming at least one through dielectric via (TDV) in the insulating encapsulation, wherein the at least one TDV electrically connects the second die and the redistribution circuit structure.

15. The method of claim 10, wherein after performing the first planarization process, tops of the first protrusion and the first bonding dielectric material are substantially coplanar.

16. A method of manufacturing a die stack structure, comprising:
bonding a first die onto a second die through a hybrid bonding structure, wherein forming the hybrid bonding structure comprises:
forming a first bonding structure on a front side of the first die, comprising:
forming a first bonding dielectric material on a first test pad of the first die, and then performing a planarization process on the first bonding dielectric material, so that a topmost surface of the first test pad is substantially level with a top surface of the first bonding dielectric material;
forming a first blocking layer over the first bonding dielectric material; and
forming a second bonding dielectric material over the first blocking layer, wherein a material of the first blocking layer is different from the first and second bonding dielectric materials; and
forming a second bonding structure on a front side of the second die, wherein a first bonding metal layer of the first bonding structure and a second bonding metal layer of the second bonding structure are in physical contact with and bonded to each other.

17. The method of claim 16, further comprising performing a first die performance test on the first test pad before the first blocking layer is formed.

18. The method of claim 17, wherein after performing the first die performance test, the first test pad has a first probe mark comprising:
a first concave portion;
a first protrusion surrounding the first concave portion; and
a first flat portion surrounding the first protrusion, wherein a plane along a top surface of the first flat portion is between a bottommost portion of the first concave portion and a topmost portion of the first protrusion.

19. The method of claim 16, wherein the first bonding structure further comprises a first dummy metal layer aside the first bonding metal layer, the first dummy metal layer is on the first test pad of the first die, and the first blocking layer is between and in physical contact with the first test pad and the first dummy metal layer to electrically isolate the first test pad from the first dummy metal layer.

20. The method of claim 19, wherein tops of the first bonding metal layer, the first dummy metal layer, and the second bonding dielectric material are substantially coplanar.

* * * * *